United States Patent
Ishikawa et al.

(10) Patent No.: US 12,144,067 B2
(45) Date of Patent: Nov. 12, 2024

(54) CERAMIC HEATER

(71) Applicant: NGK INSULATORS, LTD., Nagoya (JP)

(72) Inventors: Masaki Ishikawa, Handa (JP); Shuichiro Motoyama, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 237 days.

(21) Appl. No.: 17/301,992

(22) Filed: Apr. 21, 2021

(65) Prior Publication Data
US 2021/0243850 A1 Aug. 5, 2021

Related U.S. Application Data

(63) Continuation of application No. PCT/JP2019/050428, filed on Dec. 23, 2019.

(30) Foreign Application Priority Data

Jan. 25, 2019 (JP) .................. 2019-011302

(51) Int. Cl.
*H05B 3/26* (2006.01)
*H01L 21/67* (2006.01)

(52) U.S. Cl.
CPC ....... *H05B 3/265* (2013.01); *H01L 21/67103* (2013.01)

(58) Field of Classification Search
CPC .............. H01L 21/6833; H05B 1/0233; H05B 2203/005; H05B 2203/016; H05B 3/22; H05B 3/265; H05B 3/283
(Continued)

(56) References Cited

U.S. PATENT DOCUMENTS 10,945,312 B2  3/2021  Kurano
2001/0027972 A1*  10/2001  Yamaguchi ............ H05B 3/283
                                                               219/468.1
(Continued)

FOREIGN PATENT DOCUMENTS

JP  2005-063691 A1  3/2005
JP  2006-500789 A1  1/2006
(Continued)

OTHER PUBLICATIONS

English translation of the International Preliminary Report on Patentability (Chapter I) dated Aug. 5, 2021 (Application No. PCT/JP2019/050428).

(Continued)

*Primary Examiner* — Sang Y Paik
(74) *Attorney, Agent, or Firm* — BURR PATENT LAW, PLLC (57) ABSTRACT

A ceramic heater includes a ceramic plate, a main resistance heating element, and sub resistance heating elements. The main resistance heating element is a heating element that is disposed on a first plane parallel with a wafer placement surface in the ceramic plate and that has a coil shape. The sub resistance heating elements are heating elements that are disposed on a second plane parallel with the first plane in the ceramic plate between the first plane and the wafer placement surface, that complement heating with the main resistance heating element, and that have a two-dimensional shape.

9 Claims, 4 Drawing Sheets

(58) Field of Classification Search
USPC ........................................................ 219/451.1
See application file for complete search history.

(56) References Cited

U.S. PATENT DOCUMENTS

| | | | | |
|---|---|---|---|---|
| 2003/0062359 | A1* | 4/2003 | Ho | H01L 21/67103 |
| | | | | 219/468.1 |
| 2003/0075537 | A1 | 4/2003 | Okajima et al. | |
| 2004/0168641 | A1* | 9/2004 | Kuibira | C23C 16/4409 |
| | | | | 118/728 |
| 2005/0194374 | A1* | 9/2005 | Gelatos | H05B 3/283 |
| | | | | 219/468.1 |
| 2005/0258160 | A1* | 11/2005 | Goto | H01L 21/67103 |
| | | | | 219/270 |
| 2006/0096972 | A1* | 5/2006 | Nakamura | H01L 21/67103 |
| | | | | 219/544 |
| 2010/0243635 | A1* | 9/2010 | Nakamura | H05B 3/143 |
| | | | | 219/270 |

FOREIGN PATENT DOCUMENTS

| | | |
|---|---|---|
| JP | 3897563 B2 | 3/2007 |
| JP | 2007-088484 A | 4/2007 |
| JP | 3182120 U | 3/2013 |
| JP | 2017-152137 A | 8/2017 |
| JP | 2017-228360 A1 | 12/2017 |
| TW | 201826876 A | 7/2018 |

OTHER PUBLICATIONS

Japanese Office Action (with English translation) dated Nov. 1, 2022 (Application No. 2020-567435).
Korean Office Action (Application No. 10-2021-7013827) dated Oct. 4, 2022 (with English translation).
Taiwanese Office Action dated Apr. 20, 2023 (Application No. 108147550).

* cited by examiner

CERAMIC HEATER

BACKGROUND OF THE INVENTION

1. Field of the Invention

The present invention relates to a ceramic heater.

2. Description of the Related Art

For a semiconductor-manufacturing apparatus, a ceramic heater that heats a wafer is used. A so-called two-zone heater is known as such a ceramic heater. In a heater known as this kind of two-zone heater, as disclosed in PTL 1, an inner-circumferential resistance heating element and an outer-circumferential resistance heating element are embedded in a ceramic base on the same plane, and heat generated from the resistance heating elements is separately controlled by separately applying a voltage to the resistance heating elements. Each resistance heating element is a coil composed of high-melting-point metal such as tungsten.

CITATION LIST

Patent Literature

PTL 1: JP 3897563 B

SUMMARY OF THE INVENTION

According to PTL 1, however, the resistance heating elements are the coils, and accordingly, the adjacent coils need to be spaced from each other so as not to short-circuit. The ceramic heater has a gas hole and a lift pin hole that extend through a ceramic plate in the vertical direction, and the resistance heating elements need to detour around the holes. For this reason, there is a problem in that sufficient thermal uniformity cannot be achieved.

The present invention has been accomplished to solve the problems, and it is a main object of the present invention to achieve sufficient thermal uniformity even in the case where a coil is used as a main resistance heating element.

A ceramic heater according to the present invention includes
   a ceramic plate that has a wafer placement surface,
   a main resistance heating element that is disposed on a first plane parallel with the wafer placement surface in the ceramic plate and that has a coil shape, and
   a sub resistance heating element that is disposed on a second plane parallel with the first plane in the ceramic plate, that complements heating with the main resistance heating element, and that has a two-dimensional shape.

In the ceramic heater, the main resistance heating element that is disposed in the ceramic plate and that has a coil shape heats a wafer that is placed on the wafer placement surface. The main resistance heating element is a coil and is accordingly restricted when wired. For this reason, it is difficult to finely adjust temperature by just heating with the main resistance heating element. According to the present invention, the sub resistance heating element that has a two-dimensional shape is disposed on the second plane parallel with the first plane on which the main resistance heating element is disposed in the ceramic plate. The sub resistance heating element has a two-dimensional shape and can be accordingly manufactured by printing, and the degree of freedom of wiring can be increased (for example, a line width is decreased, and a line distance is decreased for wiring at a high density). For this reason, the sub resistance heating element can complement heating with the main resistance heating element that has a coil shape and can finely adjust the temperature. Accordingly, sufficient thermal uniformity can be achieved even in the case where the coil is used as the main resistance heating element.

The main resistance heating element and the sub resistance heating element may be composed of the same material or composed of different materials. The word "parallel" includes not only a case of being completely parallel but also a case of being substantially parallel (for example, a case of being within tolerance).

In the ceramic heater according to the present invention, the second plane may be located between the first plane and the wafer placement surface. In this case, heating with the sub resistance heating element is likely to be reflected on the temperature of the wafer placement surface, and this facilitates fine adjustment of the temperature of the wafer placement surface.

In the ceramic heater according to the present invention, the sub resistance heating element may contain ceramics. With the ceramics contained, the thermal expansion coefficient of the sub resistance heating element can be close to the thermal expansion coefficient of the ceramic plate, and bonding strength between the sub resistance heating element and the ceramic plate can be increased.

In the ceramic heater according to the present invention, the main resistance heating element may be disposed in m (m is an integer of 1 or more) zones on the first plane respectively, and the sub resistance heating element may be disposed in n (n is an integer larger than m) zones on the second plane respectively. In this case, the temperature can be separately adjusted for every zone, and this facilitates fine adjustment of the temperature of the wafer placement surface. In particular, the sub resistance heating element that is suitable to finely adjust the temperature is disposed in the zones on the second plane that is divided into the zones the number of which is larger than that of the first plane, and this facilitates fine adjustment of the temperature of the wafer placement surface.

In the ceramic heater according to the present invention, the sub resistance heating element may be divided into sectorial shapes. In this case, thermal uniformity in the circumferential direction of the ceramic plate can be improved, and temperature control can be more finely implemented.

In the ceramic heater according to the present invention, the sub resistance heating element may be nearer than the main resistance heating element to a hole. In this case, a portion around the hole that is likely to have a low temperature even when heated with the main resistance heating element is heated with the sub resistance heating element for complementing, and the temperature can be finely adjusted.

In the ceramic heater according to the present invention, the sub resistance heating element may overlap a terminal of the main resistance heating element in a plan view of the wafer placement surface. In this case, heating with the sub resistance heating element for complementing enables fine adjustment of the temperature of the vicinity right above the terminal of the main resistance heating element that is likely to have a low temperature.

DETAILED DESCRIPTION OF THE INVENTION

Figure 1:
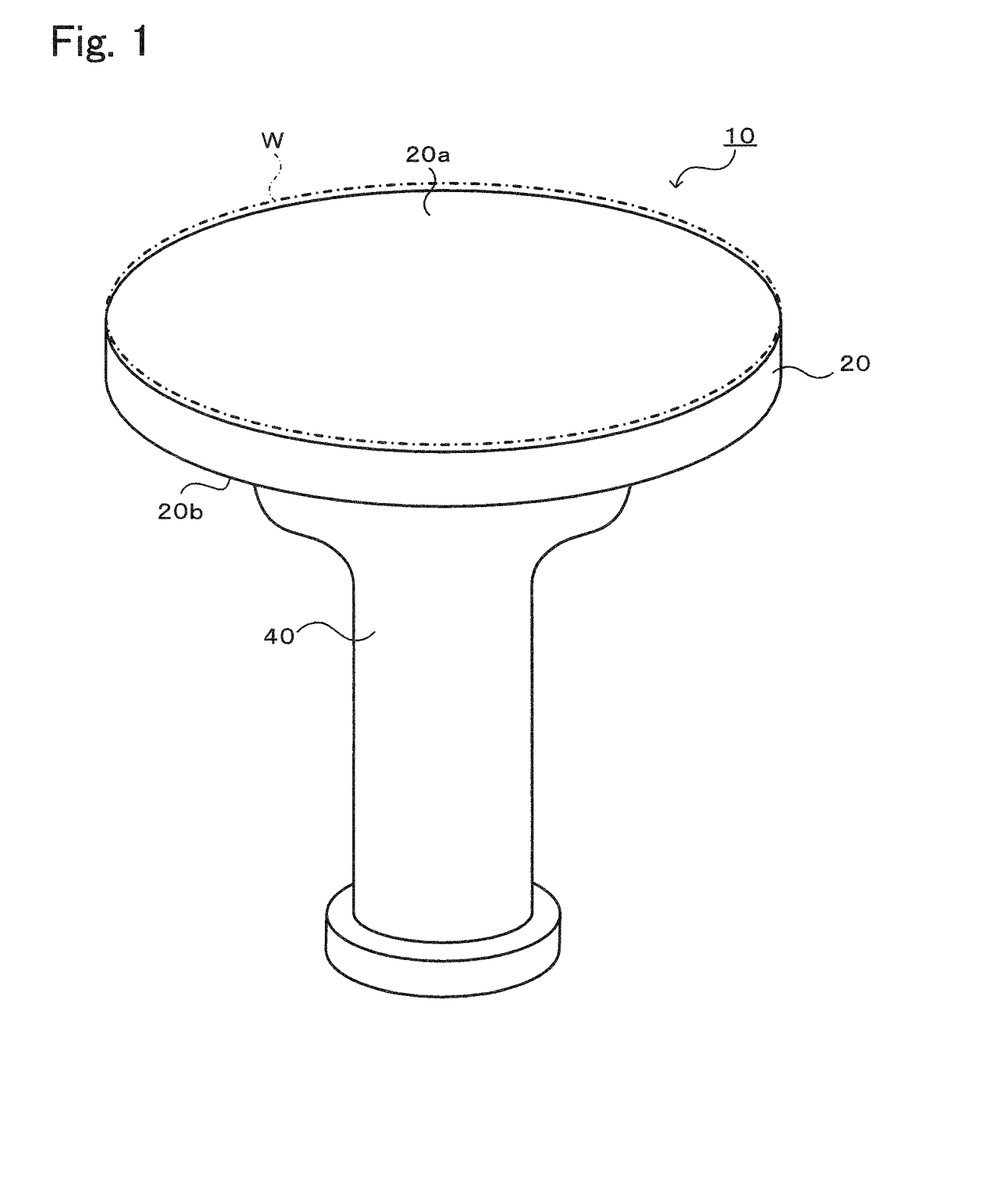
FIG. 1 is a perspective view of a ceramic heater 10.
Figure 2:
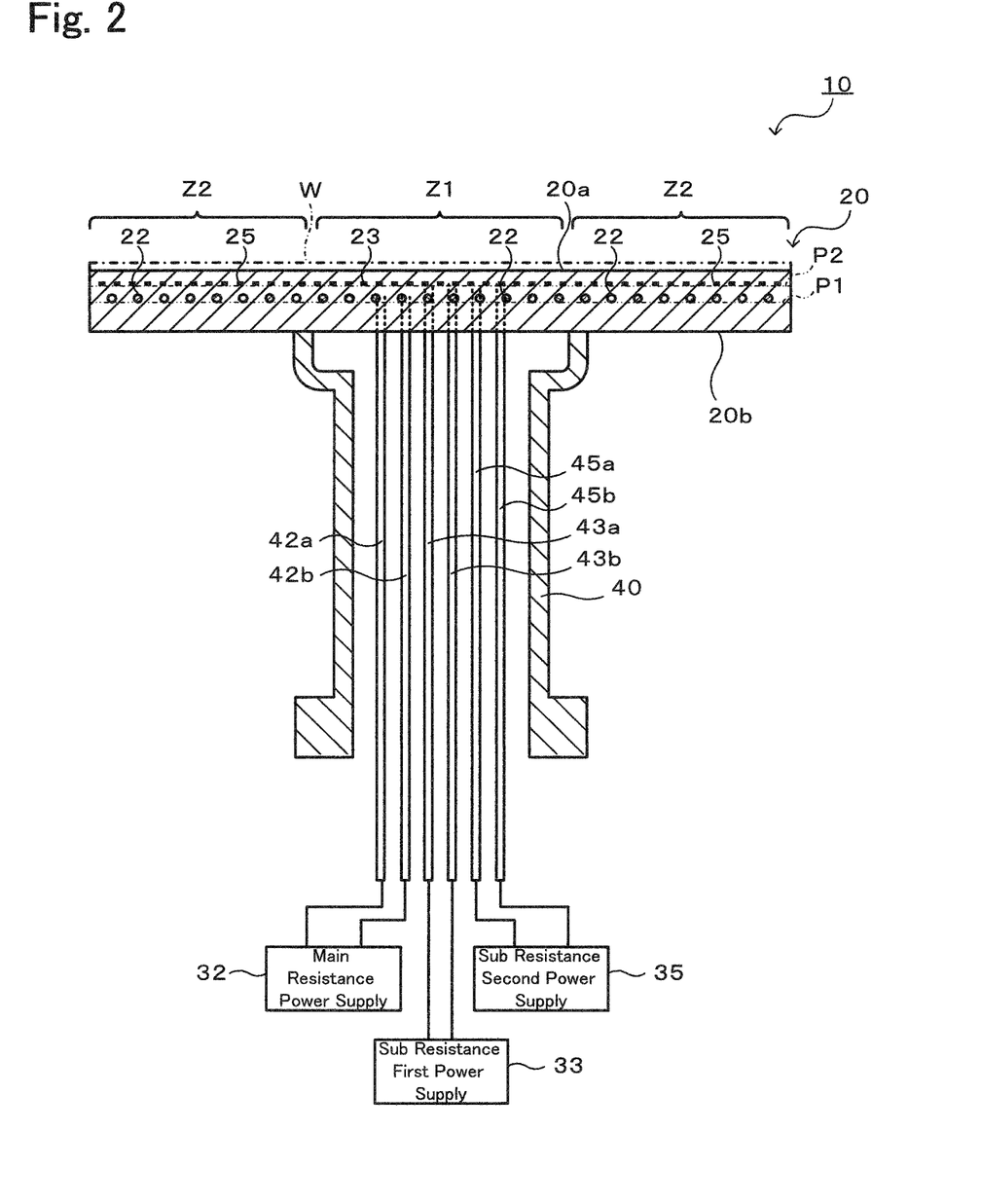
FIG. 2 is a longitudinal sectional view of the ceramic heater 10.
Figure 3:
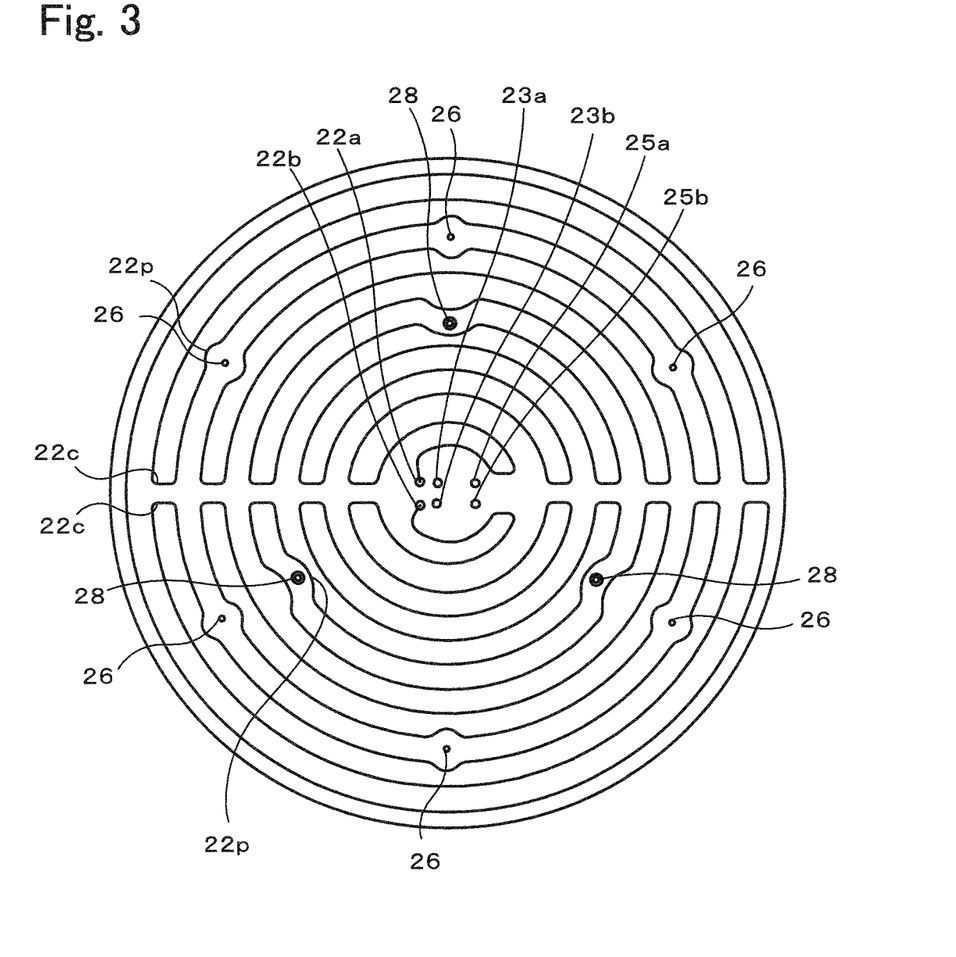
FIG. 3 is a sectional view of a ceramic plate 20 taken along a first plane P1 and viewed from above.
Figure 4:
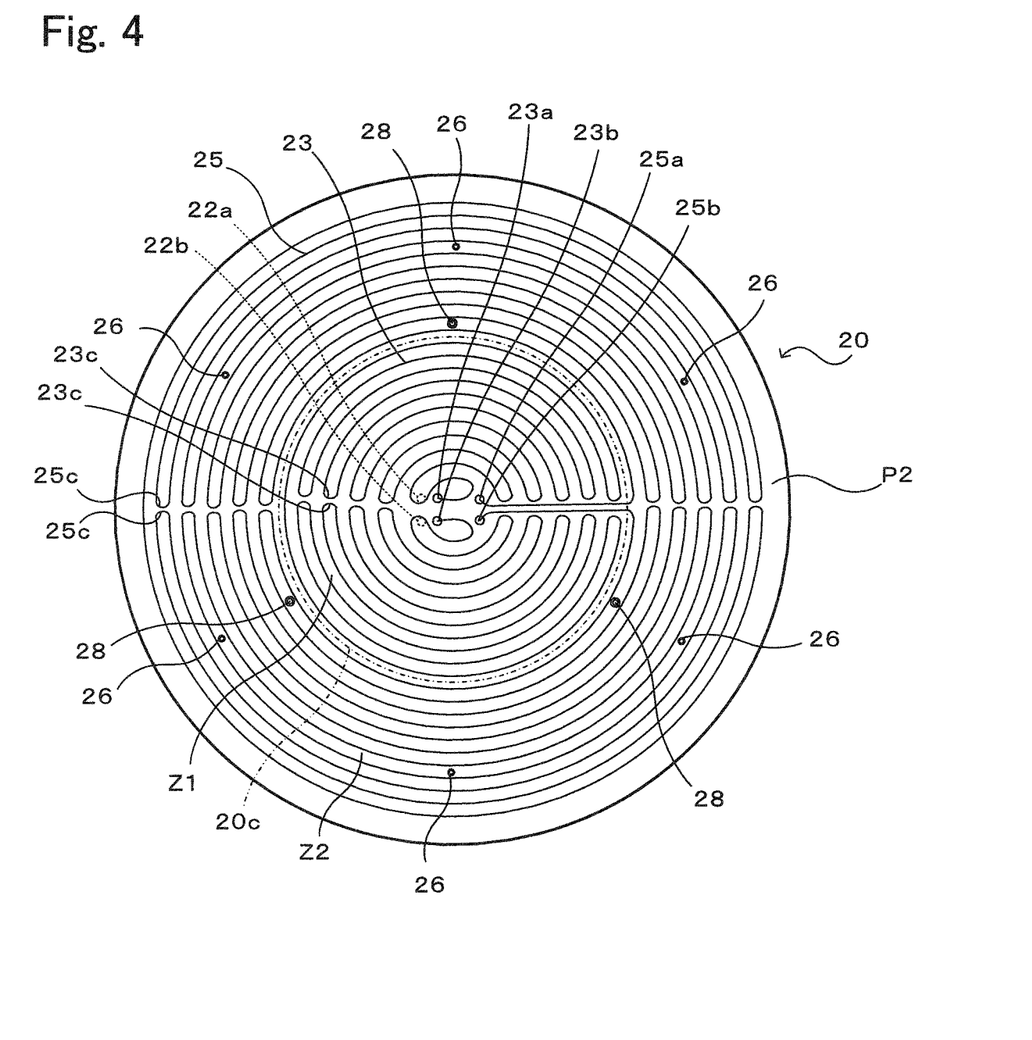
FIG. 4 is a sectional view of the ceramic plate 20 taken along a second plane P2 and viewed from above.

A preferred embodiment of the present invention will hereinafter be described with reference to the drawings. FIG. 1 is a perspective view of a ceramic heater 10 according to the present embodiment. FIG. 2 is a longitudinal sectional view (a sectional view of the ceramic heater 10 taken along a plane containing a central axis) of the ceramic heater 10. FIG. 3 is a sectional view of a ceramic plate 20 taken along a first plane P1 and viewed from above. FIG. 4 is a sectional view of the ceramic plate 20 taken along a second plane P2 and viewed from above. In FIG. 3 and FIG. 4, hatching representing a section is omitted.

The ceramic heater 10 is used to heat a wafer that is subjected to a process such as etching or CVD and is installed in a vacuum chamber not illustrated. The ceramic heater 10 includes the ceramic plate 20 that has a wafer placement surface 20a and that is discoid, and a tubular shaft 40 that is joined coaxially with the ceramic plate 20 to a surface (a back surface) 20b of the ceramic plate 20 opposite the wafer placement surface 20a.

The ceramic plate 20 is a discoid plate composed of a ceramic material, representatively, aluminum nitride or alumina. The diameter of the ceramic plate 20 is, for example, about 300 mm. Fine irregularities are formed on the wafer placement surface 20a of the ceramic plate 20 by an embossing process, although these are not illustrated. The ceramic plate 20 has the first plane P1 that is parallel with the wafer placement surface 20a and that is imaginary and the second plane P2 that is parallel with the first plane P1 and that is imaginary. The second plane P2 is located between the first plane P1 and the wafer placement surface 20a. An imaginary boundary 20c (see FIG. 4) that is concentric with the ceramic plate 20 divides the second plane P2 of the ceramic plate 20 into an inner-circumferential zone Z1 that has a small circular shape and an outer-circumferential zone Z2 that has an annular shape. The diameter of the imaginary boundary 20c is, for example, about 200 mm. A main resistance heating element 22 is disposed on the first plane P1 of the ceramic plate 20. On the second plane P2 of the ceramic plate 20, an inner-circumferential sub resistance heating element 23 is disposed in the inner-circumferential zone Z1, and an outer-circumferential sub resistance heating element 25 is disposed in the outer-circumferential zone Z2. The main resistance heating element 22 and the sub resistance heating elements 23 and 25 are thus embedded in the ceramic plate 20.

As illustrated in FIG. 3 and FIG. 4, the ceramic plate 20 has gas holes 26. The gas holes 26 extend through the ceramic plate 20 from the back surface 20b to the wafer placement surface 20a. Gas is supplied to spaces between the irregularities that are formed on the wafer placement surface 20a and a wafer W that is placed on the wafer placement surface 20a. The gas that is supplied to the spaces improves heat conduction between the wafer placement surface 20a and the wafer W. The ceramic plate 20 also has lift pin holes 28. The lift pin holes 28 extend through the ceramic plate 20 from the back surface 20b to the wafer placement surface 20a, and lift pins, not illustrated, are inserted therein. The lift pins lift the wafer W that is placed on the wafer placement surface 20a. According to the present embodiment, the lift pin holes 28 are concentrically arranged at a regular interval, and the number thereof is plural (three here).

As illustrated in FIG. 3, the main resistance heating element 22 extends from one of a pair of terminals 22a and 22b disposed on a central portion (a region of the back surface 20b of the ceramic plate 20 that is surrounded by the tubular shaft 40) of the ceramic plate 20, is folded at folded portions 22c in a one-stroke pattern, is wired over the substantially entire first plane P1, and reaches the other of the pair of the terminals 22a and 22b. The main resistance heating element 22 includes curved portions 22p that detour around the gas holes 26 and the lift pin holes 28. The main resistance heating element 22 is a coil a main component of which is high-melting-point metal or carbide thereof. Examples of the high-melting-point metal include tungsten, molybdenum, tantalum, platinum, rhenium, hafnium, and an alloy thereof. Examples of the carbide of the high-melting-point metal include tungsten carbide and molybdenum carbide. The main resistance heating element 22 is the coil, and accordingly, a space between adjacent parts of the coil is set to be relatively wide so as not to short-circuit.

As illustrated in FIG. 4, the inner-circumferential sub resistance heating element 23 extends from one of a pair of terminals 23a and 23b disposed on the central portion of the ceramic plate 20, is folded at folded portions 23c in a one-stroke pattern, is wired over the substantially entire inner-circumferential zone Z1, and reaches the other of the pair of the terminals 23a and 23b. The inner-circumferential sub resistance heating element 23 overlaps the terminals 22a and 22b of the main resistance heating element 22 in a plan view of the wafer placement surface 20a. As illustrated in FIG. 4, the outer-circumferential sub resistance heating element 25 extends from one of a pair of terminals 25a and 25b disposed on the central portion of the ceramic plate 20, is folded at folded portions 25c in a one-stroke pattern, is wired over the substantially entire outer-circumferential zone Z2, and reaches the other of the pair of the terminals 25a and 25b. The inner-circumferential sub resistance heating element 23 and the outer-circumferential sub resistance heating element 25 are ribbons (a flat elongated shape) composed of high-melting-point metal or carbide thereof and is formed by applying the high-melting-point metal or the paste of the carbide thereof by printing. For this reason, the sub resistance heating elements 23 and 25 enable the degree of freedom of wiring to be increased. Specifically, the line width of each ribbon of the sub resistance heating elements 23 and 25 is less than the coil diameter of the main resistance heating element 22. The wiring is such that a space between adjacent parts of each ribbon of the sub resistance heating elements 23 and 25 is narrower than the space between the adjacent parts of the coil of the main resistance heating element 22. The sub resistance heating elements 23 and 25 are also wired such that a portion at which folded portions 23c face each other and a portion at which folded portions 25c face each other are narrower than a portion at which folded portions 22c of the main resistance heating element 22 face each other. The sub resistance heating elements 23 and 25 are wired up to the vicinity of the gas holes 26 and the lift pin holes 28 compared to the main resistance heating element 22.

The tubular shaft 40 is composed of ceramics such as aluminum nitride or alumina as in the ceramic plate 20. The inner diameter of the tubular shaft is, for example, about 40 mm, and the outer diameter thereof is, for example, about 60 mm. The upper end of the tubular shaft 40 is diffusion-joined to the ceramic plate 20. Power supply rods 42a and 42b that are connected to the respective terminals 22a and 22b of the main resistance heating element 22 are disposed in the tubular shaft 40. Power supply rods 43a and 43b that are connected to the respective terminals 23a and 23b of the inner-circumferential sub resistance heating element 23 and power supply rods 45a and 45b that are connected to the respective terminals 25a and 25b of the outer-circumferential sub resistance heating element 25 are disposed in the tubular shaft 40. The power supply rods 42a and 42b are connected to a main resistance power supply 32, the power supply rods 43a and 43b are connected to a sub resistance first power supply 33, and the power supply rods 45a and 45b are connected to a sub resistance second power supply 35. Gas supply pipes through which gas is supplied to the gas holes 26 and the lift pins that are inserted in the lift pin holes 28 are also disposed in the tubular shaft 40 although these are not illustrated.

An example of the use of the ceramic heater 10 will now be described. The ceramic heater 10 is first installed in the vacuum chamber not illustrated, and the wafer W is placed on the wafer placement surface 20a of the ceramic heater 10. The power supplies 32, 33, and 35 adjust power that is supplied to the resistance heating elements 22, 23, and 25 such that the temperature of the inner-circumferential zone Z1 that is detected by an inner-circumferential thermocouple not illustrated becomes a predetermined inner-circumferential target temperature, and the temperature of the outer-circumferential zone Z2 that is detected by an outer-circumferential thermocouple not illustrated becomes a predetermined outer-circumferential target temperature. Consequently, the temperature of the wafer W is controlled so as to be the desired temperature. At this time, the main resistance heating element 22 that is formed as the coil is accordingly used to roughly control the temperatures of the zones Z1 and Z2 to be the target temperatures. The inner-circumferential and outer-circumferential sub resistance heating elements 23 and 25 that are formed as the ribbons wired at a higher density than the coil are accordingly used to finely adjust the temperatures of the zones Z1 and Z2 to be the target temperatures. Settings are adjusted such that the interior of the vacuum chamber becomes a vacuum atmosphere or a decompression atmosphere, plasma is produced in the vacuum chamber, a CVD film is formed on the wafer W by using the plasma, and etching is performed.

As for the ceramic heater 10 according to the present embodiment described above, the sub resistance heating elements 23 and 25 have a ribbon shape and can be accordingly manufactured by printing, the line width and a line distance can be decreased, and the degree of freedom of wiring can be increased. For this reason, the sub resistance heating elements 23 and 25 can complement heating with the main resistance heating element 22 that have a coil shape and finely adjust the temperature. Accordingly, sufficient thermal uniformity can be achieved even in the case where the coil is used as the main resistance heating element 22.

The main resistance heating element 22 is the coil and is accordingly restricted when wired. The reason is as follows. In some cases where the ceramic heater 10 is manufactured, the coil is embedded in ceramics powder and is subsequently fired. In these cases, the coil moves in the ceramics powder. The coil needs to be wired in consideration for this. For this reason, for example, wiring needs to be such that the space between the adjacent parts of the coil and the portion at which the folded portions 22c face each other in the main resistance heating element 22 are relatively wide. For example, the main resistance heating element 22 needs to be wired so as to detour around the gas holes 26 and the lift pin holes 28. For this reason, the temperatures of the space between the adjacent parts of the coil, the portion at which the folded portions 22c face each other, and portions around the holes 26 and 28 are likely to be lower than that of the other portion, and it is difficult to finely adjust the temperatures. The sub resistance heating elements 23 and 25 that are the ribbons that have a higher degree of freedom of wiring than that of the coil are wired such that the line distance is shorter than that of the main resistance heating element 22 and are wired up to the vicinity of the holes 26 and 28. For this reason, a portion that is likely to have a low temperature even when heated with the main resistance heating element 22 is heated with the sub resistance heating elements 23 and 25 for complementing, and the temperature thereof can be finely adjusted. The space between the parts of the coil typically needs to be about 1 mm in length. However, the space between the parts of each ribbon can be about 0.3 mm in length because the ribbon can be manufactured by printing.

The main resistance heating element 22 and the sub resistance heating elements 23 and 25 are disposed on the respective different planes P1 and P2 in the ceramic plate, and accordingly, the degree of freedom of wiring of the sub resistance heating elements 23 and 25 can be higher than that in the case where these are disposed on the same plane. For this reason, fine adjustment of the temperature of the wafer placement surface 20a is facilitated. The main resistance heating element 22 is a resistance heating element that has a coil shape, which typically generates heat in a larger amount than a resistance heating element that has a ribbon shape, and the sub resistance heating elements 23 and 25 are resistance heating elements that have a ribbon shape the thickness of which is less than that of the resistance heating element that has a coil shape. For this reason, the thicknesses of the resistance heating elements can be less than those in the case where these have a coil shape, and hence the thickness of the ceramic plate 20 can be decreased. The amount of heat generation is readily increased to a higher level than that in the case where these have a ribbon shape, and this is suitable to increase the temperature of the ceramic heater 10.

The second plane P2 on which the sub resistance heating elements 23 and 25 are disposed is located between the first plane P1 on which the main resistance heating element 22 is disposed and the wafer placement surface 20a. Accordingly, heating with the sub resistance heating elements 23 and 25 is likely to be reflected on the temperature of the wafer placement surface 20a. For this reason, fine adjustment of the temperature of the wafer placement surface 20a is facilitated.

The sub resistance heating elements 23 and 25 are disposed in the respective two zones Z1 and Z2 on the second plane P2 and can accordingly separately adjust the temperature for every zone. In particular, the sub resistance heating elements 23 and 25 that are suitable to finely adjust the temperature are disposed on the respective zones Z1 and 22 on the second plane P2 that is divided into the zones the number of which is larger than that of the first plane P1. This facilitates fine adjustment of the temperature of the wafer placement surface 20a. The sub resistance heating elements 23 and 25 have a high degree of freedom of wiring and is accordingly suitable for multi-zone.

The inner-circumferential sub resistance heating element 23 overlaps the terminals 22a and 22b of the main resistance heating element 22 in a plan view of the wafer placement surface 20a. Accordingly, heating with the inner-circumferential sub resistance heating element 23 for complementing enables fine adjustment of the temperature of the vicinity right above the terminals 22a and 22b of the main resistance heating element 22 that is likely to have a low temperature.

It is without saying that the present invention is not limited to the embodiment described above, and that various embodiments can be carried out provided that the embodiments are included in the technical range of the present invention.

For example, according to the embodiment described above, the sub resistance heating elements 23 and 25 are the ribbons but are not particularly limited thereto, and any shape may be used provided that the shape is a two-dimensional shape. The two-dimensional shape enables manufacturing to be performed by applying paste by printing. Accordingly, the sub resistance heating elements 23 and 25 can be readily thinned and can be wired at a high density.

The sub resistance heating elements 23 and 25 according to the embodiment described above may contain ceramics. For example, when the sub resistance heating elements 23 and 25 are formed by printing, paste may contain ceramics. In this way, the thermal expansion coefficients of the sub resistance heating elements 23 and 25 can be close to the thermal expansion coefficient of the ceramic plate 20, and bonding strength between the sub resistance heating elements 23 and 25 and the ceramic plate 20 can be increased.

According to the embodiment described above, the second plane P2 is located between the first plane P1 and the wafer placement surface 20a. However, the second plane P2 may be located between the first plane P1 and the back surface 20b of the ceramic plate 20.

According to the embodiment describe above, the space between the parts of each ribbon of the sub resistance heating elements 23 and 25 is narrower than the space between the parts of the coil of the main resistance heating element 22. However, any wiring is acceptable provided that heating with the sub resistance heating elements 23 and 25 can complement heating with the main resistance heating element 22. For example, the space between the parts of each ribbon of the sub resistance heating elements 23 and 25 may have the same level of length as the space between the parts of the coil of the main resistance heating element 22, and the sub resistance heating elements 23 and 25 may be wired at portions facing the space between the parts of the coil of the main resistance heating element 22. The line width of each ribbon of the sub resistance heating elements 23 and 25 is less than the coil diameter of the main resistance heating element 22 but may be equal to or more than the coil diameter of the main resistance heating element 22.

According to the embodiment described above, the ceramic plate 20 may contain an electrostatic electrode. In this case, the wafer W can be electrostatically sucked and held on the wafer placement surface 20a by applying a voltage to the electrostatic electrode after the wafer W is placed on the wafer placement surface 20a. The ceramic plate 20 may contain a RF electrode. In this case, a shower head, not illustrated, is disposed with a space created above the wafer placement surface 20a, and high-frequency power is supplied between parallel flat plate electrodes including the shower head and the RF electrode. In this way, plasma is produced, a CVD film can be formed on the wafer W by using the plasma, and etching can be performed. The electrostatic electrode may double as the RF electrode.

According to the embodiment described above, the outer-circumferential zone Z2 on the second plane P2 is described as a single zone but may be divided into small zones. In this case, the resistance heating elements are wired for every small zone. Each small zone may be formed into an annular shape by dividing the outer-circumferential zone Z2 by a boundary line concentric with the ceramic plate 20 or may be formed into a sectorial shape (a shape obtained by unfolding the side surface of a truncated cone) by dividing the outer-circumferential zone Z2 by lines radially extending from the center of the ceramic plate 20. The division into a sectorial shape enables thermal uniformity in the circumferential direction of the ceramic plate 20 to be improved and enables temperature control to be more finely implemented.

According to the embodiment described above, the inner-circumferential zone Z1 on the second plane P2 is described as a single zone but may be divided into small zones. In this case, the resistance heating elements are wired for every small zone. Each small zone may be formed into an annular shape and a circular shape by dividing the inner-circumferential zone Z1 by a boundary line concentric with the ceramic plate 20 or may be formed into a sectorial shape (a shape obtained by unfolding the side surface of a cone) by dividing the inner-circumferential zone Z1 by lines radially extending from the center of the ceramic plate 20.

According to the embodiment described above, the second plane P2 is divided into the inner-circumferential zone Z1 that has a circular shape and the outer-circumferential zone Z2 that has an annular shape but may be formed into a sectorial shape (a shape obtained by unfolding the side surface of a cone) by dividing the second plane P2 by lines radially extending from the center of the ceramic plate 20.

According to the embodiment described above, the first plane P1 is described as a single zone but may be divided into two or more small zones. In this case, the main resistance heating element is wired for every small zone. A method of the division into the small zones is appropriately selected from division methods described for the second plane P2. In this case, the second plane P2 is preferably divided into zones the number of which is larger than the number of the zones of the first plane P1. This facilitates fine adjustment of the temperature of the wafer placement surface by using the sub resistance heating elements.

The present application claims priority from Japanese Patent Application No. 2019-011302, filed on Jan. 25, 2019, the entire contents of which are incorporated herein by reference.

What is claimed is:
1. A ceramic heater comprising:
a ceramic plate that has a wafer placement surface;
a tubular shaft that is joined with the ceramic plate to a surface of the ceramic plate opposite the wafer placement surface;
a main resistance heating element that is disposed on a first plane parallel with the wafer placement surface in the ceramic plate and that has a coil shape; and
a sub resistance heating element that is disposed on a second plane parallel with the first plane in the ceramic plate, that complements heating with the main resistance heating element, and that has a two-dimensional shape;
wherein the main resistance heating element is disposed in m zones on the first plane respectively, wherein m is an integer of 1 or more, and wherein each of the m main resistance heating element zones has a pair of main terminals for a total of 2m main terminals;

wherein the sub resistance heating element is disposed in n zones on the second plane respectively, wherein n is an integer larger than m, and wherein each of the n sub resistance heating element zones has a pair of sub terminals for a total of 2n sub terminals;

wherein the sub resistance heating element having the two-dimensional shape is nearer than the main resistance heating element having the coil shape to a hole and a pair of portions of the sub resistance heating element that is positioned around the hole are located between a pair of portions of the main resistance heating element that is positioned around the hole in plan view;

wherein the sub resistance heating element overlaps a terminal of the main resistance heating element in a plan view of the wafer placement surface; and wherein the 2m terminals of the main resistance heating element zones and the 2n terminals of the sub resistance heating element zones are all disposed in the tubular shaft in a plan view of the wafer placement surface.

2. The ceramic heater according to claim 1, wherein the second plane is located between the first plane and the wafer placement surface.

3. The ceramic heater according to claim 1, wherein the sub resistance heating element contains ceramics.

4. The ceramic heater according to claim 1, wherein the sub resistance heating element is divided into sectorial shapes.

5. The ceramic heater according to claim 1, wherein the sub resistance heating element is wired such that a portion at which folded portions face each other is narrower than a portion at which portions of the main resistance heating element face each other.

6. The ceramic heater according to claim 1, wherein a line width of the sub resistance heating element is less than the coil diameter of the main resistance heating element.

7. The ceramic heater according to claim 1, wherein a space between parts of each ribbon of the sub resistance heating element is about 0.3 mm in length.

8. The ceramic heater according to claim 1, wherein m=1 and n=2 such that the 2 main terminals of the main resistance heating element zones and that the 4 sub terminals of the sub resistance heating element zones are all disposed in the tubular shaft in a plan view of the wafer placement surface.

9. The ceramic heater according to claim 1, wherein m=2 and n=3 such that 4 main terminals of the main resistance heating element zones and that the 6 sub terminals of the sub resistance heating element zones are all disposed in the tubular shaft in a plan view of the wafer placement surface.

* * * * *